United States Patent [19]

Hansen

[11] Patent Number: 5,123,375
[45] Date of Patent: Jun. 23, 1992

[54] STRUCTURE FOR FILTERING CVD CHAMBER PROCESS GASES

[75] Inventor: Keith J. Hansen, San Jose, Calif.

[73] Assignee: LSI Logic Corporation, Milpitas, Calif.

[21] Appl. No.: 591,646

[22] Filed: Oct. 2, 1990

Related U.S. Application Data

[62] Division of Ser. No. 461,959, Jan. 8, 1990.

[51] Int. Cl.$^5$ .............................................. C23C 16/00
[52] U.S. Cl. ..................................... 118/715; 55/267; 55/350; 55/482
[58] Field of Search ..................... 53/267, 350, 482; 118/715

[56] References Cited

U.S. PATENT DOCUMENTS 1,455,116 5/1923 Lumley .................................. 55/350

Primary Examiner—Bernard Nozick
Attorney, Agent, or Firm—Skjerven, Morrill, MacPherson, Franklin & Friel

[57] ABSTRACT

A structure for filtering process gases prior to said process gases being allowed to enter a CVD chamber includes improved filter and control means to ensure high purity of the process gases. In one embodiment, a first filter means is located in a first section of a gas line being isolated by valves at both ends of the gas line section. A second filter means is located in a downstream gas line section for further filtering.

4 Claims, 10 Drawing Sheets

STRUCTURE FOR FILTERING CVD CHAMBER PROCESS GASES

This application is a division of application Ser. No. 07/461,959, filed Jan. 8, 1990.

FIELD OF THE INVENTION

This invention relates to integrated circuits implemented in silicon, and in particular to an improved process for providing electrical contact to silicon using a refractory metal.

BACKGROUND OF THE INVENTION

In providing electrical connections to silicon for microelectronics applications, it is frequently desired to provide a conductive interface between a metallization layer, such as aluminum (Al), and the portion of silicon to be electrically connected to the aluminum to prevent direct contact of the aluminum with the silicon. If aluminum were to be directly deposited onto the silicon, various problems may arise.

One significant problem in depositing aluminum directly on silicon is that the aluminum acts as a P-type dopant, and any migration of aluminum atoms into a silicon region would dope the silicon region with P-type impurities. This is especially significant when the aluminum contacts an N-type silicon region, where the migration of P-type aluminum atoms into the silicon region results in an undesired rectifying contact.

Another problem is that the aluminum is prone to spiking through shallow silicon regions, thus causing the aluminum to contact the underlying or adjacent silicon region.

A further problem relates to the shadowing effect, where an oxide layer is etched to expose a silicon region, and the relatively high step between the top surface of the oxide and the exposed silicon results in uneven deposition of aluminum on the exposed silicon surface and on the oxide walls. This may even result in an open circuit due to insufficient aluminum being deposited on the exposed silicon or oxide walls.

With decreasing geometries, the above problems become more acute. Further, increased reaction temperatures exacerbate the above-mentioned problems, since the migration of aluminum atoms into the silicon is accelerated with increasing temperatures. Additionally, over a period of time, the aluminum atoms further migrate into the silicon causing latent defects and low reliability contacts.

Various schemes are used in the prior art to avoid the above-mentioned problems incurred by direct contact of aluminum with silicon,. On way to overcome the above-mentioned problems is to saturate the aluminum during deposition with silicon (typically 0.2-1 weight % of Si to Al) to inhibit migration of the aluminum atoms. One drawback with this method is that the saturation level of aluminum is higher at higher temperatures so that when the saturated aluminum cools, a precipitate of silicon exists at the surface of the silicon substrate under the aluminum layer, resulting in an undesired P-type epitaxial layer. Additionally, the problem of shadowing effect still exists using the above method.

Another prior art method used to avoid the problems resulting from direct contact of aluminum with silicon is to form on or more interface layers over the silicon before depositing the aluminum metallization layer.

This type of process is generally described din U.S. Pat. No. 3,777,364 to Schinella et al., although numerous other patents describe similar processes. In this prior art method, a refractory metal, such as tungsten, molybdenum, palladium, platinum, or tantalum, is deposited and reacted with the exposed silicon (or a polysilicon layer) to form a silicide layer. The tope portion of the deposited refractory metal, which has not reacted with the silicon, may then be removed. The aluminum metallization layer is then deposited. The resulting silicide layer between the aluminum and silicon acts as a barrier to the aluminum atoms, preventing migration of the aluminum into the silicon, and provides a low resistivity contact between the aluminum and the silicon. Additionally, this type of process slightly reduces the step height (e.g., by 1200 Å) during deposition of the aluminum metal layer.

A problem with the above teaching of forming a silicide layer is that, when forming, for example tungsten silicide as the interface layer between aluminum and silicon using a chemical vapor deposition (CVD) process and tungsten hexafluoride ($WF_6$) as the reactant gas, the high temperatures involved in the CVD process cause the hot CVD chamber walls to react with the $WF_6$ gas. This results in a lowering of the deposition rate of the tungsten onto the surface of the wafer.

Although sputtering tungsten onto the surface of the wafer does not incur the problem of hot walls of a chamber reacting with the metallic fluoride gas, sputtering refractory metal films is subject to the following limitations: (1) such films are frequently highly stressed and crack; (2) such films are characterized by relatively poor step coverage; (3) such films are relatively costly to produce; (4) only a relatively small number of wafers can be processed in a given amount of time; and (5) sputtering equipment is relatively expensive to purchase and operate.

Thus, using a hot-wall CVD process to deposit a refractory metal onto the silicon results in the deposition rate being limited, and the problem with step height is not avoided to the extend desirable.

U.S. Pat. No. 4,794,019 to Miller describes a tungsten deposition process using a hot-wall CVD chamber and mentions that the deposition rate of the tungsten decreases with time to reach a stable value of 25 Å/min at a thickness of about 3000 Å (col. 3, lines 31–33). Miller teaches a CVD process temperature on the order of 300° C. to deposit the tungsten on the surface of the silicon wafer. Since tungsten nucleates well to silicon but not to $SiO_2$ at this temperature, this process is used to selectively deposit the tungsten on the silicon and not on $SiO_2$. By using this method, however, an increase in the thickness of the refractory metal over approximately 3000 Å is relatively time consuming and expensive.

One way used to solve the problem of low deposition rates due to the hot walls of the a chamber reacting with the metallic fluoride gas is to heat the wafers locally using direct irradiation of the wafer by means of a quartz halogen lamp or some other source of radiation. This method of heating the wafer, however, results in different refractory metal deposition rates on N and P type silicon regions due to the different emissivities of these two regions when heated by a radiation source. This uneven deposition increases the difficulty of efficiently depositing a metal interconnect layer providing good electrical contact to both the N and P type silicon regions.

What would be desirable in the industry is a method of depositing a refractory metal as a barrier layer between aluminum and silicon at a relatively high deposition rate so as to reduce step height to a desirable amount, and which would result in an even deposition of refractory metal over both exposed N an P type silicon regions.

SUMMARY OF THE INVENTION

The present inventive process relates to the deposition of a refractory metal onto a silicon surface for use in the manufacture of microelectronic circuits. In one embodiment the deposition is a controllable selective deposition.

To avoid the various problems discussed previously, a cold wall radiantly heated chemical vapor deposition (CVD) system is preferably used to deposit the refractory metal, wherein each wafer is heated by, for example, a broad band light source. Thus, the deposition of the refractory metal onto the wafer to form a barrier layer between the silicon substrate and an aluminum layer will not be limited by any reaction of the process gases (e.g., $WF_6$) with high temperature chamber walls.

In a preferred embodiment, to avoid the varying deposition rates on N and P type silicon regions due to the different emissivities of these two regions when subjected to radiation, an optically opaque layer (e.g., at least 100-500 Å), of the refractory metal is first formed on both the N and P type silicon regions prior to the N and P type regions reaching a temperature of approximately 100° C. The opaque layer is desirable to form at below 100° C. since at above 100° C. the emissivities of the N and P type regions begin to widely diverge. Once the opaque refractory metal layer has been established, the emissivities of both and N and P type regions at the higher processing temperatures will be approximately that of the refractory metal, thereby establishing an approximately equivalent deposition rate on both N and p type silicon regions.

Additionally, at the higher deposition temperatures (e.g., 200°-300° C.), in the preferred embodiment, the amount of reducing gas (e.g., $SiH_4$) introduced into the CVD chamber to reduce the refractory metal gas (e.g., $WF_6$) is ramped up with time so that, as the thickness of the deposited refractory metal increases and the temperature of the contact area increase due to the exothermic reduction reactions, more reducing gas is made available in the CVD chamber to increase the deposition rate of the refractory metal.

The various steps used in the preferred process for forming a silicide barrier layer comprise: (1) cleaning the exposed surface of a silicon wafer to remove organic and metallic contamination from the silicon regions to be contacted; (2) cleaning the surface of the wafer to remove oxide from the silicon regions to be contacted; (3) removing any damage to the silicon crystal lattice structure so that the refractory metal will nucleate rapidly and in a predictable manner; (4) urging the various gas lines and process chamber to ensure high purity of the process gases and accurate flow rates; (5) saturating the silicon surface at approximately room temperature (3 e.g., 20°-30° C.) with a refractory metal gas to form an initial layer of refractory metal on the silicon surface to act as a catalyst for subsequent deposition of the refractory metal and to form a strong bond between the silicon surface and the subsequently formed barrier layer; (6) ramping the temperature of the wafer, while injecting process gases into the CVD chamber, at a slow enough rate to form an optically opaque layer (e.g., at least 100-500 Å) of refractory metal on the exposed silicon regions prior to the temperature of the regions reaching approximately 100° C.; (7) heating the wafer at a relatively constant deposition temperature while ramping up the supply of reducing gas to increase the deposition rate of refractory metal as the exothermic reduction reactions continue to increase the temperature of the deposited refractory metal layer; (8) annealing the wafer at a temperature above approximately 650° C. to silicide the refractory metal/silicon surface interface and to react the silicon atoms within the deposited refractory metal to form a silicide in order to lower contact resistivity; and (9) cooling the wafer before removal from the CVD chamber.

In the preferred embodiment of the novel process summarized above, a silicon-based reducing gas (e.g., $SiH_4$) is used in step 7 to reduce the refractory metal gas (e.g., $WF_6$) so that silicon atoms are deposited along with the refractory metal. Thus, when the refractory metal and silicon undergo the thermal anneal step 8, the silicon substrate is to significantly consumed.

In addition to the previously described features providing the advantages of high deposition rate and equal deposition on N and P type regions, further novel features of the above described process include using a high conductance vacuum system to limit the residence time of any impurities in the chamber, using a novel diffusing means inside the CVD chamber for diffusing process gases as they enter the CVD chamber, and using an improved gas distribution and filtering system.

An additional novel process step includes cleaning the CVD chamber, after completing a number of refractory metal deposition processes, by heating the CVD chamber to above approximately 65° C. during in-situ $NF_3$ cleaning of the CVD chamber to avoid condensation of by-products on the walls of the chamber.

Minor modifications of the deposition process summarized above enable the process to be used for blanket deposition of a refractory metal and for deposition of a refractory metal for use as a via between two conductive layers. A novel apparatus is also describe for forming vias, which enables the transfer of wafers from a sputter etch station to a CVD chamber under low pressure.

DETAILED DESCRIPTION OF THE INVENTION

A. SELECTIVE DEPOSITION PROCESS

Figure 1A:
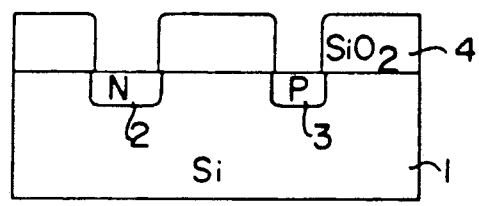
FIGS. 1a-1e are cross-sectional diagrams of a silicon wafer undergoing a refractory metal deposition process in accordance with a preferred embodiment of the invention.

To selectively deposit a refractory metal on an exposed silicon surface for improved electrical contact between a metallization layer and the silicon, while achieving the advantages previously described, the below-described preferred process is used.

Initially, a silicon wafer is processed using well known and conventional methods to form various regions in the silicon substrate for electrical contact thereto by an aluminum interconnection layer. A layer of silicon dioxide or other insulating layer is then formed over the surface of the wafer and etched using well known techniques to selectively expose regions of the silicon substrate for electrical contact of these exposed regions with the metal layer. An illustrative process for forming exposed silicon regions is described in U.S. Pat. No. 4,546,370, incorporated herein by reference.

A(1). REMOVE CONTAMINATION FROM EXPOSED SILICON SURFACE

In step 1 of the preferred process to selectively form a barrier layer over the exposed silicon regions, the wafer is subjected to a 120° C. sulfuric peroxide acid bath for approximately five minutes to remove organic and metallic contamination from the exposed substrate surface. Any of the well known and conventional techniques for removing contaminants may also be used for this step. This step may be omitted if the contamination of the exposed substrate surface is deemed to be insignificant.

A(2). REMOVE OXIDE FROM EXPOSED SILICON SURFACE

In step 2, the wafer is subjected to a buffered oxide etchant, such as that comprising five parts ammonium fluoride, one part hydrofluoric acid, and eight parts water, for approximately six second s at room temperature. This step removes native and other oxides from the exposed substrate surface. This step may be omitted if the exposed surface is deemed to be sufficiently free of oxide. Any number of other conventional and well known techniques for removal step also removes a portion of the surface of the patterned oxide; however, since this patterned oxide is relatively thick, this reduction in its thickness is negligible.

A(3). REMOVE ANY DAMAGE TO CRYSTALLINE STRUCTURE

In step 3, any damage to the exposed silicon surface caused by any ion implantation or etching process is removed by a conventional nitrogen trifluoride ($NF_3$) silicon etch or any other conventional and well known etching technique which would accomplish this step. This particular process using an $NF_3$ etchant actually removes a top layer of the silicon where the damage to the crystal structure occurs. The silicon crystal lattice damage is preferably removed so that the refractory metal will nucleate rapidly with the silicon surface and in a predictable manner. This step may be omitted if the damage to the crystal lattice structure is not significant.

Instead of an etch of the silicon to remove any damage, a rapid thermal anneal may be performed to realign the silicon atoms and reform the crystal lattice structure. This anneal step is preferably conducted at between approximately 600° C.-850° C. for ten to sixty seconds depending on the type and amount of damage to be repaired.

A representative wafer having undergone steps 1-3 is shown in FIG. 1a. Silicon wafer 1 is shown having exposed N type region 2 and P type region 3, and having patterned oxide layer 4. Wafer 1 is then placed in a CVD chamber such as that shown in FIG. 3 and described in U.S. Pat. No. 4,796,562, incorporated herein by reference. The CVD chamber of FIG. 3 will be described later.

A(4). PURGE GAS LIENS FOR HIGH PURITY

In step 4, to ensure gas purity and stability, the process gases are purged through a bypass-to-waste vacuum line for at least seven seconds before the gas is allowed to be routed into the CVD process chamber containing wafer 1. To achieve the highest gas purity, this step 4 is conducted after each completed deposition process; however, this step may be omitted depending on the purity level tolerable and the desired accuracy of the flow rates.

Figure 2A:
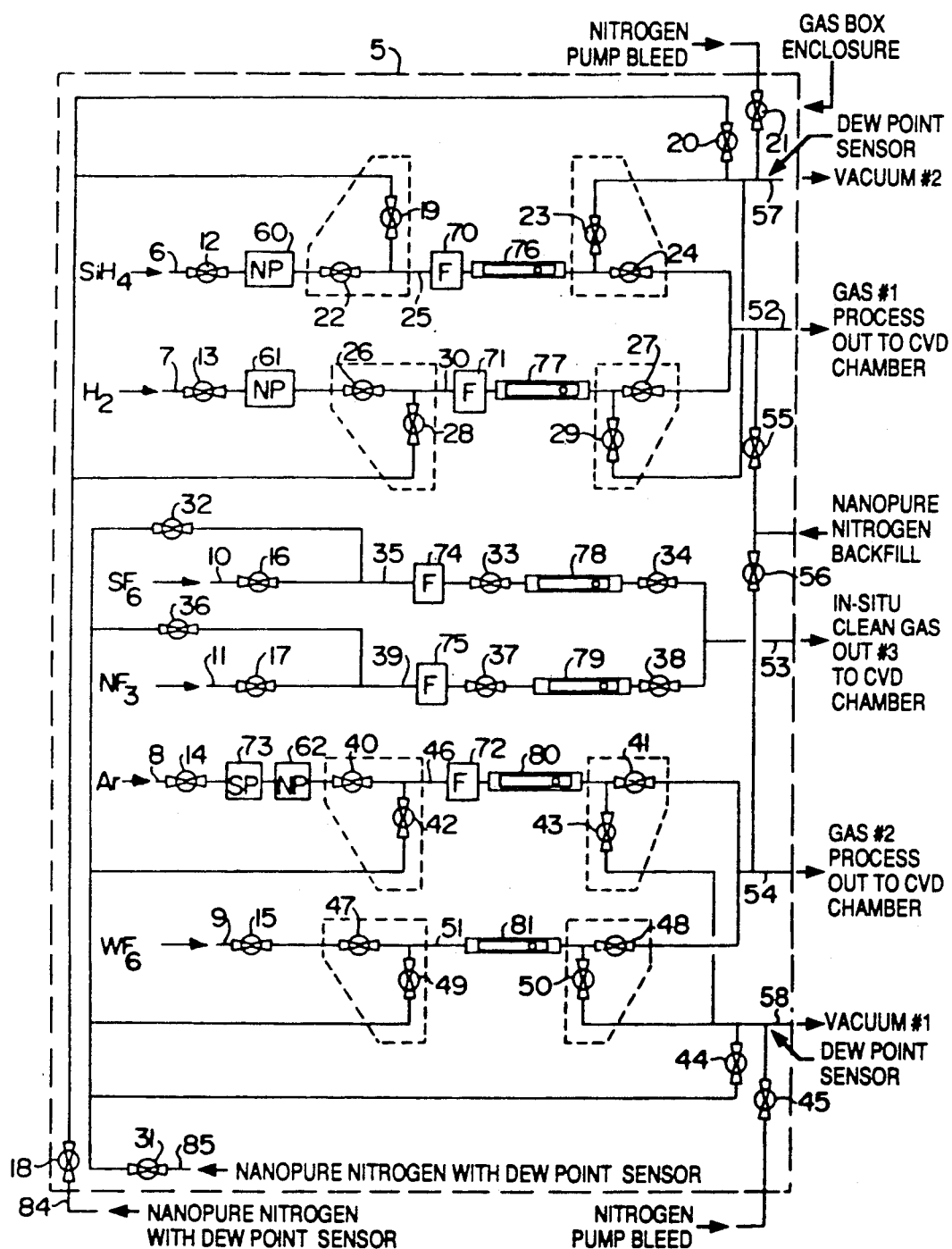
FIG. 2a shows the components within a gas distribution box used in the preferred embodiment of the invention.

FIG. 2a is a schematic diagram of the gas routing, filtering, and purification network 5 used in the preferred embodiment CVD system. In the preferred embodiment, high purity (e.g., at least 99.999% pure) process gases $SiH_4$, $H_2$, Ar, and $WF_6$ are supplied to input ports 6, 7, 8, and 9, respectively, of network 5 as shown. CVD chamber etchant gas $SF_6$ and $NF_3$ are supplied to input ports 10 and 11, respectively. To maintain high purity, all gas lines used are electropolished stainless steel.

Initially, during standby mode between processing of wafer lots when the deposition system will not be used for four hours or more, process gas valves 12-15, 22, 24, 26, 27, 40, 41, 47, and 48 are closed to isolate process gas lines 25, 30, 46, and 51. Etchant gas valves 16, 17, 34 and 38 are closed, as well as $N_2$ valve 32, since these lines do not need to be purged of impurities. Also, nitrogen backfill valves 55 and 56 are closed, as the backfill is used solely for dilution of the toxic and/or pyrophoric gases, and for diagnostic purposes, during maintenance. All other valves are open to pressurize the process gas lines with $N_2$ to prevent contaminants from entering the lines. Specifically, valves 18-21 and 23 are opened to allow $N_2$ to pressurize $SiH_4$ gas line 25. Valves 28 and 29 are opened to allow $N_2$ to pressurize $H_2$ gas line 30.

Valves 31 and 42-45 are opened to allow $N_2$ to pressurize Ar gas line 46. Valves 49 and 50 are opened to allow $N_2$ to pressurize $WF_6$ gas line 51.

Gas lines 52, 53, and 54 connect to gas lines leading into a CVD chamber and are isolated for network 5 by the closure of the appropriate valves as discussed above.

A vacuum system connected to vacuum lines 57 and 58 pull $N_2$ through the various process gas lines at a rate of approximately 1 liter/minute during this standby mode. The various mass flow controllers (MPCs) 76, 77, 80, and 81 are of the high bypass type, such as the STEC model 3400SL-SP-UC bakeable MFC, available from STEC Corporation of Japan. The valves within dashed lines are of a monoblock design and are valves within dashed lines are of a monoblock design and are high precision valves, such as Motoyama model MVILM00BB, available for Motoyama Corporation of Japan.

To accomplish step 4 to purge $SiH_4$ gas line 25 and $H_2$ gas line 30 after a wafer has been placed in the CVD chamber, valves 19, 20, and 28 are closed to cut off the supply of $N_2$ to gas lines 25 and 30.

Next, valves 12, 13, 22 and 26 are opened to allow the $SiH_4$ and $H_2$ gases to flow through lines 25 and 30 and through vacuum line 57. The flow rate of the $SiH_4$ and $H_2$ is determined by the pressure created by a pump (not shown) connected to vacuum line 57 and the extent of opening of MFC's 76 and 77. Preferably, the flow rate of all the gases during this purging step is equal to the flow rates to be used during the refractory metal deposition process so that there will be no surging of the process gases when the gases are allowed to enter gas line 52.

To purge Ar gas line 46 and $WF_6$ gas line 51, valves 42, 44, and 49 are closed to cut off the supply of $N_2$ to gas lines 46 and 51.

Next, valves 14, 15, 40 and 47 are opened to allow the Ar and $WF_6$ gases to flow through lines 46 and 51 and through vacuum line 58. The flow rates of the Ar and $WF_6$ are determined by the pressure created by a pump (not shown) connected to vacuum line 58 and the extent of opening of MFC's 80 and 81 and are set to be equal to the flow rates to be used during the refractory metal deposition process.

This purging of the gas lines is to be maintained for at least seven seconds to ensure high purity and flow rate stability.

Process gases may now be controlled to enter the CVD process chamber via gas lines 52 or 54 by controlling valves 23, 24, 27, 29, 41, 43, 48, and 50 connected between vacuum lines 57 and 58, process gas lines 25, 30, 46, and 51, and CVD gas lines 52 and 54.

The $SiH_4$ reducing gas entering input port 6, the $H_2$ gas entering input port 7, and the Ar gas entering input port 8 are filtered by appropriate Nanochem TM filters 60, 61, and 62, respectively, which contain an organometallic compound, and again filtered by conventional porous type gas filters 70, 71, and 72, respectively. Nanochem TM [filters are manufactured by Semi-Gas, Inc., San Jose. Calif. The Ar gas is additionally filtered by Saes-Purifier TM filter 73, model St707, containing fettering material Zr-V-Fe. Etchant gases $SF_6$ and $NF_3$ are filtered by conventional porous type filters 74 and 75, respectively. The flow of the gases in lines 25, 30, 35, 39, 46, and 51 is controlled and measured by mass flow controllers (MFC) 76-71, respectively.

Dew point sensors (not shown) are placed in vacuum lines 57 and 58, and in $N_2$ lines 84 and 85, to detect whether the $H_2O$ vapor content in these lines is below a predetermined level.

Figure 2B:
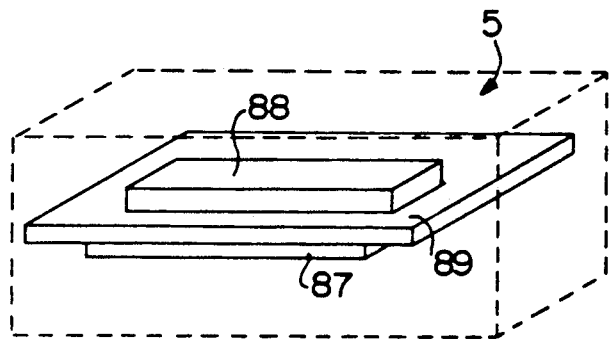
FIG. 2b shows the gas distribution box of FIG. 2a along with heating elements used for baking components within the distribution box.
Figure 6:
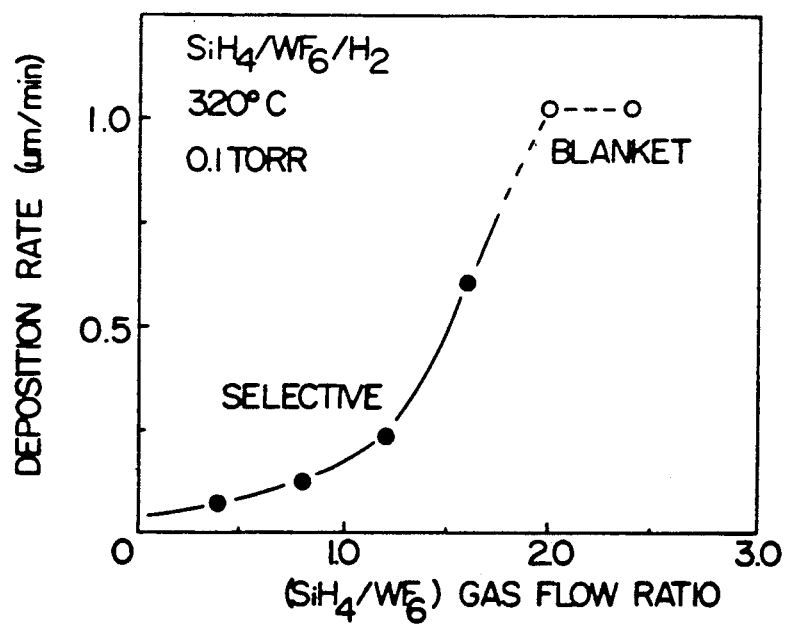
FIG. 6 is a graph showing deposition rate vs. $SiH_4/WF_6$ ratio.

Prior to being used as part of a CVD system, gas routing and filtering network 5 is baked at approximately 125° C. for approximately 37 hours to bake out the water vapor in the gas lines. As represented in FIG. 2b, resistive heating elements 87 are contained within the network 5 enclosure for this purpose. The components 88 comprising network 5 are mounted on an aluminum substrate 89, and resistive heating elements 87 are mounted on the other side of the substrate 89 for heating the substrate and baking components 88. Residual gas analyzers are used to detect impurities in the gas lines.

Between wafers, when the deposition system is in a short term standby mode, all gases in process gas lines 25, 30, 46, and 51 are withdrawn via vacuum lines 57 and 58 to prevent thermal siphoning and/or corrosion. This is accomplished by closing valves 22, 24, 26, 27, 40, 41, 47, and 48 and opening valves 23, 29, 43, and 50 to coupled gas lines 25, 30, 46, and 51 to vacuum lines 47 and 58.

Other well known process gases for performing the function, described in detail below of gases $SiH_4$, $H_2$, Ar, and $WF_6$ may be substituted for the gases used in the preferred process described herein.

A(5) SATURATE EXPOSED SILICON SURFACES WITH REFRACTORY METAL BASED GAS

Figure 1B:
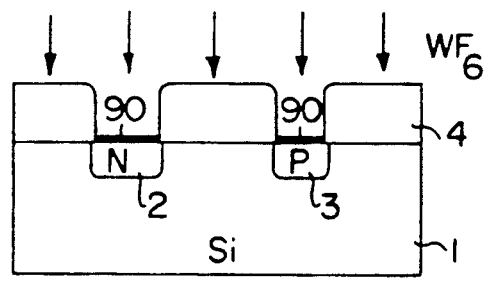

In step 5, as shown in FIG. 1b, a refractory metal based gas is allowed to enter the CVD process chamber containing wafer 1 to saturate the exposed silicon regions 2 and 3 at room temperature (e.g., less than 30° C.) before any reducing gas is pumped into the chamber. In a preferred embodiment, $WF_6$ is used to saturate the silicon substrate surface. However, any well known refractory metal based gas which can be reduced by silicon to deposit a refractory metal layer may also be used. This saturation step results in the $WF_6$ being reduced by the exposed silicon so as to form a few monolayers of tungsten 90 on the exposed silicon regions 2 and 3. The $WF_6$ is reduced by the exposed silicon in accordance with the following reaction:

$$2WF_6 + 3Si \rightarrow 2W + 3SiF_4 \quad \text{(eq. 1)}$$

As seen from eq. 1, the fluorine atoms from the $WF_6$ are removed as a volatile reaction product ($SiF_4$), and tungsten is deposited on the surface of the silicon. At room temperature, the reaction of the Si surface with the $WF_6$ may not be sufficient to form a refractory metal layer which covers the entire surface of the exposed silicon. This base layer of tungsten bonds strongly with the exposed silicon and, thus, increases the bonding strength of the subsequently formed barrier layer with the silicon substrate. This base layer also acts as a catalyst for the deposition of additional tungsten to promote the selective deposition of the refractory metal on essentially only the silicon and not on the $SiO_2$ insulating layer 4. A layer of tungsten is not formed on $SiO_2$ layer 4, since the $SiO_2$ will not significantly reduce the $WF_6$ at room temperatures.

In the preferred embodiment, step 5 is conducted by controlling process gas valves 27, 41 and 48 of FIG. 2 to control the flow of $H_2$, Ar, and $WF_6$ entering the CVD chamber.

Table I below shows process parameters for the various steps used in the preferred embodiment process for selectively depositing a refractory metal layer. Step 5 corresponds to parameter setting A in Table I.

TABLE I

| Parameter Setting | Dur. (sec) | Temp. (°C.) | Pressure (mtorr) | BSGAS (torr) | SiH$_4$ (sccm) | WF$_6$ (sccm) | H$_2$ (sccm) | Ar (sccm) |
|---|---|---|---|---|---|---|---|---|
| A | 7 | Ambient (A) (≦30° C.) | 80 | 0.5 | 0 | 4.0 | 150 | 5 |
| B | 5 | A (≦30° C.) | 80 | 0.5 | 2.6 | 4.0 | 150 | 5 |
| C | 45 | 260 (A→260) | 80 | 0.5 | 2.6 | 4.0 | 150 | 5 |
| D | 10 | 260 | 80 | 0.5 | 2.6 | 4.0 | 150 | 5 |
| E | 10 | 260 | 80 | 0.5 | 2.8 | 4.0 | 150 | 5 |
| F | 10 | 260 | 80 | 0.5 | 3.0 | 4.0 | 150 | 5 |
| G | 10 | 260 | 80 | 0.5 | 3.2 | 4.0 | 150 | 5 |
| H | 10 | 260 | 80 | 0.5 | 3.4 | 4.0 | 150 | 5 |
| I | 5 | A (260→A) | BASE (≦18 mtorr) | 0 | 0 | 0 | 0 | 0 |
| J | 45 | A | 800 | 1.0 | 0 | 0 | 300 | 50 |
| K | 5 | A | BASE | 0 | 0 | 0 | 0 | 0 |
| L | 20 | 700 (A→700) | 80 | 0.5 | 0 | 0 | 150 | 5 |

As seen from Table I, this step is conducted for approximately 7 seconds at a WF$_6$ flow rate of 4.0 sccm (standard cubic centimeters per minute) and a CVD chamber pressure of 80 mtorr.

To maintain the proper flow rate and pressure in the CVD chamber, H$_2$ is also injected into the chamber at a rate of 150 sccm by opening valve 27. H$_2$ does not act as a reducing gas at this low temperature and, thus, acts as an inert gas. A small amount of Ar gas is also injected into the chamber at a rate of 5 sccm by opening valve 41. The Ar gas is used as a carrier gas to facilitate the flow of WF$_6$ in gas line 54.

Figure 3:
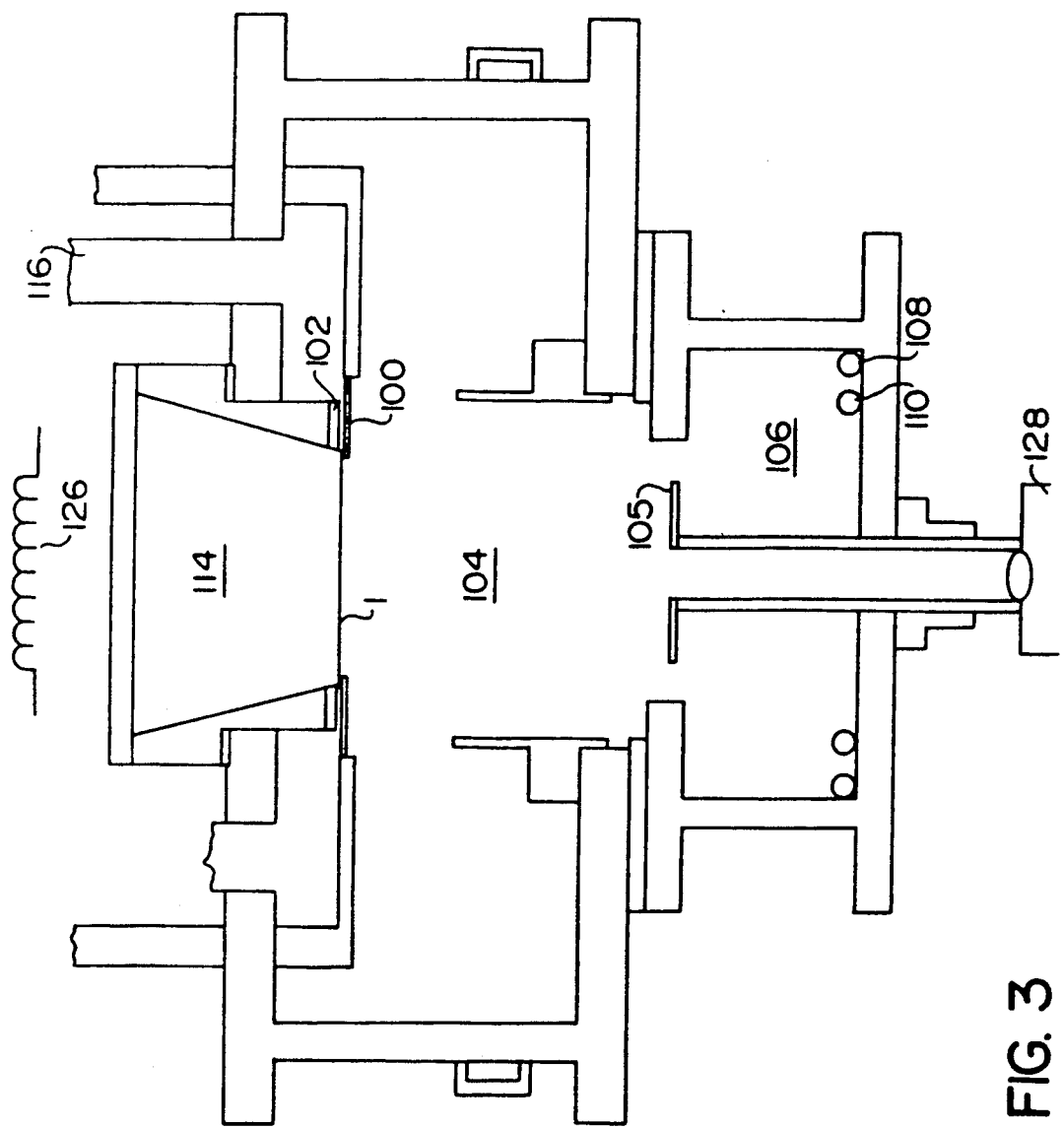
FIG. 3 shows a CVD chamber used in the preferred embodiment f the invention.

FIG. 3 is a cross-sectional diagram of the chamber portion of a modified Varian Model 5101 CVD system used in the preferred embodiment process. The Varian Model 5101 CVD system is described in U.S. Pat. No. 4,796,562, incorporated herein by reference.

In FIG. 3, wafer 1 is shown held in place by wafer clamp assembly 100, securing wafer 1 to quartz chuck 102, and having a front surface facing reaction chamber 104. The refractory metal based gas (e.g., WF$_6$) is injected into chamber 104 through outer gas injector ring 108, where ring 108 allows the gas to exit through a diffusing means forming a portion of the wall of ring 108. A novel diffusing means is used in the preferred embodiment process and will be described in detail later with reference to FIGS. 11-12. The gas enters ring 108 through an inlet port (not shown), which is connected to gas line 54 in FIG. 2. As seen in FIG. 2, ar gas also flows through gas line 54.

Inner gas injector ring 110 is similar to ring 108 and is connected to gas line 52 in FIG. 2 for the injection of the reducing gas (e.g., SiH$_4$) and H$_2$ into chamber 104. Gas deflector 105 acts to help mix the gases injected into gas mixing chamber 106 prior to the gases entering into reaction chamber 104.

Further features of the CVD chamber of FIG. 3 will be explained when pertinent to a particular process step. Further details of the CVD chamber of FIG. 3 can be obtained from U.S. Pat. No. 4,796,562.

In the preferred embodiment process in accordance with parameter setting A in Table I, backside chamber 114 is made to have a pressure of 0.5 torr by injecting Ar gas into backside chamber 114 via an inlet port (not shown). A pressure transducer (not shown) located in backside chamber 114 is used to measure the pressure in backside chamber 114. The precise value of the relatively high backside chamber pressure is not significant as long as the pressure is sufficient to prevent process gases in reaction chamber 104 from entering backside chamber 114 and nucleating with the back surface of silicon wafer 1. However, the backside pressure should not exceed approximately 1.0 torr because loss of selectivity around the wafer edge may occur.

In accordance with parameter setting A in Table I, the reaction chamber pressure is maintained at 80 mtorr.

The gases in reaction chamber 104 are withdrawn via high conductance vacuum port 116 through openings in wafer clamp assembly 100 so as to keep the residence time of any byproducts in chamber 104 below 10 milliseconds. The rate of withdrawal of the gases in chamber 104 keeps the process gases flowing at the desired rate and maintains the desired reaction chamber pressure.

A(6). FORM OPTICALLY OPAQUE REFRACTORY METAL LAYER ON N AND P TYPE REGIONS AT LOW TEMPERATURE

In step 6, the temperature of the wafer is slowly increased above room temperature by a directed radiation source while injecting the refractory metal based gas (e.g., WF$_6$) into the reaction chamber so that the refractory metal deposition rate on the silicon is very low.

As the temperature of the water is slowly ramped up, but still held below approximately 100° C., the refractory metal based gas is reduced by the exposed silicon on the surfaces of n type region 2 and P type region 3 in FIG. 1c and reduced by the silicon which diffused through the base layer of refractory metal deposited in step 5. The refractory metal 120 is deposited over both N and P type silicon regions 2 and 3 on tungsten 90 at essentially equal rates, since the emissivities of N and P type silicon at temperatures below 100° C. are essentially equal.

Figure 4:
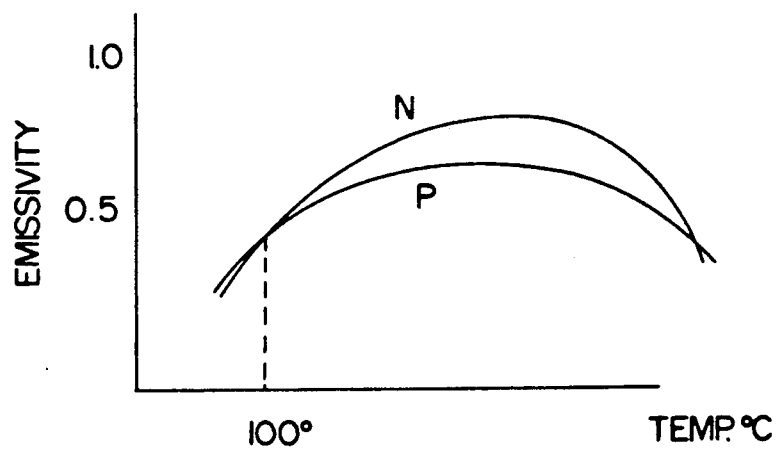
FIG. 4 is a graph showing emissivity vs. temperature of N and P type silicon regions.

Since the emissivities of N and P type silicon begin to diverge rapidly at approximately 100° C. as shown graphically in FIG. 4, the temperature ramp must be slow enough to provide a resulting deposition of at least an optically opaque layer (e.g., 100-500 Å) of refractory metal 120/90 on both N and p type silicon regions 2 and 3 before the substrate temperature reaches approximately 100° C. The layer only need be opaque to the frequencies outputted by the radiant heating means used in the CVD chamber. Once the opaque refractory metal layer has been established, the emissivities of both N and P type silicon regions 2 and 3 will approximate that of the refractory metal deposited, thereby establishing an approximately equivalent deposition rate over both N and P type regions at the higher deposition temperatures.

Figure 1C:
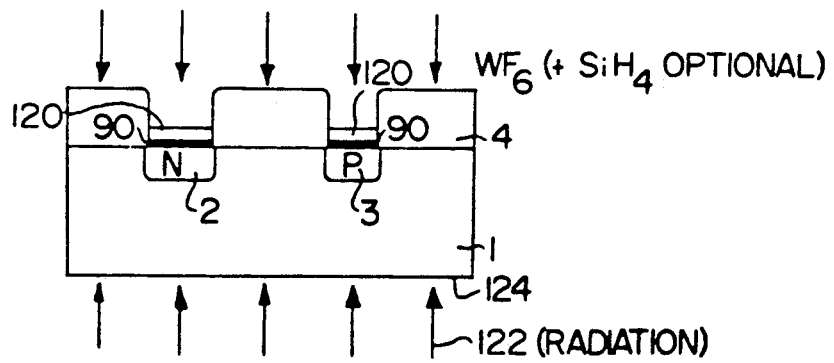

FIG. 1c shows radiation 122 irradiating back substrate surface 124 of wafer 1, while opaque refractory metal layer 120 forms over N type region 2 and P type region 3. By using WF$_6$ as the refractory metal based gas, an opaque layer of tungsten is formed in this step in accordance with the previously shown exothermic reduction reaction of eq. 1.

Without any reducing gas entering the chamber, the reduction reaction consumes a few atomic thickness layers of the silicon substrate during the deposition of the opaque layer of tungsten over the exposed silicon regions. Since there is essentially no reduction of the refractory metal based gas with the silicon dioxide insulating layer 4 at this low temperature, there is essentially no deposition of refractory metal on the silicon dioxide layer 4.

In the preferred embodiment, this step 6 (parameter settings B and C in Table I) is carried out by providing ramped power to quartz halogen lamp 126, shown in FIG. 3, while WF$_6$ is being injected into chamber 104 at a rate of 4 sccm. As shown in parameter settings B and C in Table I, lamp 126 remains off for five seconds, then is ramped up to 260° C. over a period of 45 seconds. The flow rates of H$_2$ and Ar, as well as the chamber pressure and backside chamber pressure, remain the same as in step 5.

Pyrometer 128, shown in FIG. 3, is used to measure the average temperature of the wafer and provides feedback for temperature control.

Also in this preferred embodiment process shown in Table I, even though the opaque layer 120/90 can be formed without any reducing gas entering the reaction chamber 104, silicon tetrahydride (SiH$_4$) reducing gas, also known as silane, is injected into chamber 104 at a flow rate of 2.6 sccm to help reduce the WF$_6$ so as to increase the deposition rate of the refractory metal and to ensure very little of the silicon surface is consumed by the reduction process.

A(7). RAMP SUPPLY OF REDUCING GAS AT DEPOSITION TEMPERATURES

In step 7, the deposition temperature is held between 230° C. and 425° C. for a time to deposit a desired thickness of tungsten or other refractory metal on the selected areas of the silicon wafer. During this time, the refractory metal based gas is injected into the chamber along with a reducing gas to reduce the refractory metal based gas, since the silicon from the substrate is no longer able to diffuse through the deposited metal layer to reduce the refractory metal based gas. In the preferred embodiment, the refractory metal based gas WF$_6$ and the reducing gas is SiH$_4$, which causes the following exothermic reactions, depending on the relative amount of SiH$_4$ in the chamber:

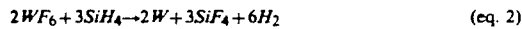

$$2WF_6 + 3SiH_4 \rightarrow 2W + 3SiF_4 + 6H_2 \qquad \text{(eq. 2)}$$

$$2WF_6 + 4.2SiH_4 \rightarrow 0.4W_5Si_3 + 3SiF_4 + 8.4H_2 \qquad \text{(eq. 3)}$$

The reduction reactions shown in equations 2 and 3 occur in the following manner. The WF$_6$ fluorinates the surface of the opaque tungsten layer deposited in step 6. SiH$_4$ reacts readily on this fluorinated surface to deposit silicon and form volatile silicon fluorides (SiF$_4$). The deposited layer of silicon then reacts with the WF$_6$ gas molecules impinging on the silicon layer to produce the reduction reaction of equation 1. Thus, the reactions shown in equations 2 and 3 are actually the results of a series of sub-reactions, where in the WF$_6$/SiH$_4$ reduction reaction, tungsten film growth proceeds through cycles of tungsten/silicon deposition. Since neither the WF$_6$ or SiH$_4$ significantly stick to the insulating silicon dioxide layer 4 at these relatively low deposition temperatures, there is essentially no deposition of tungsten on the insulating silicon dioxide layer and, thus, selective deposition of tungsten is obtained.

Figure 5:
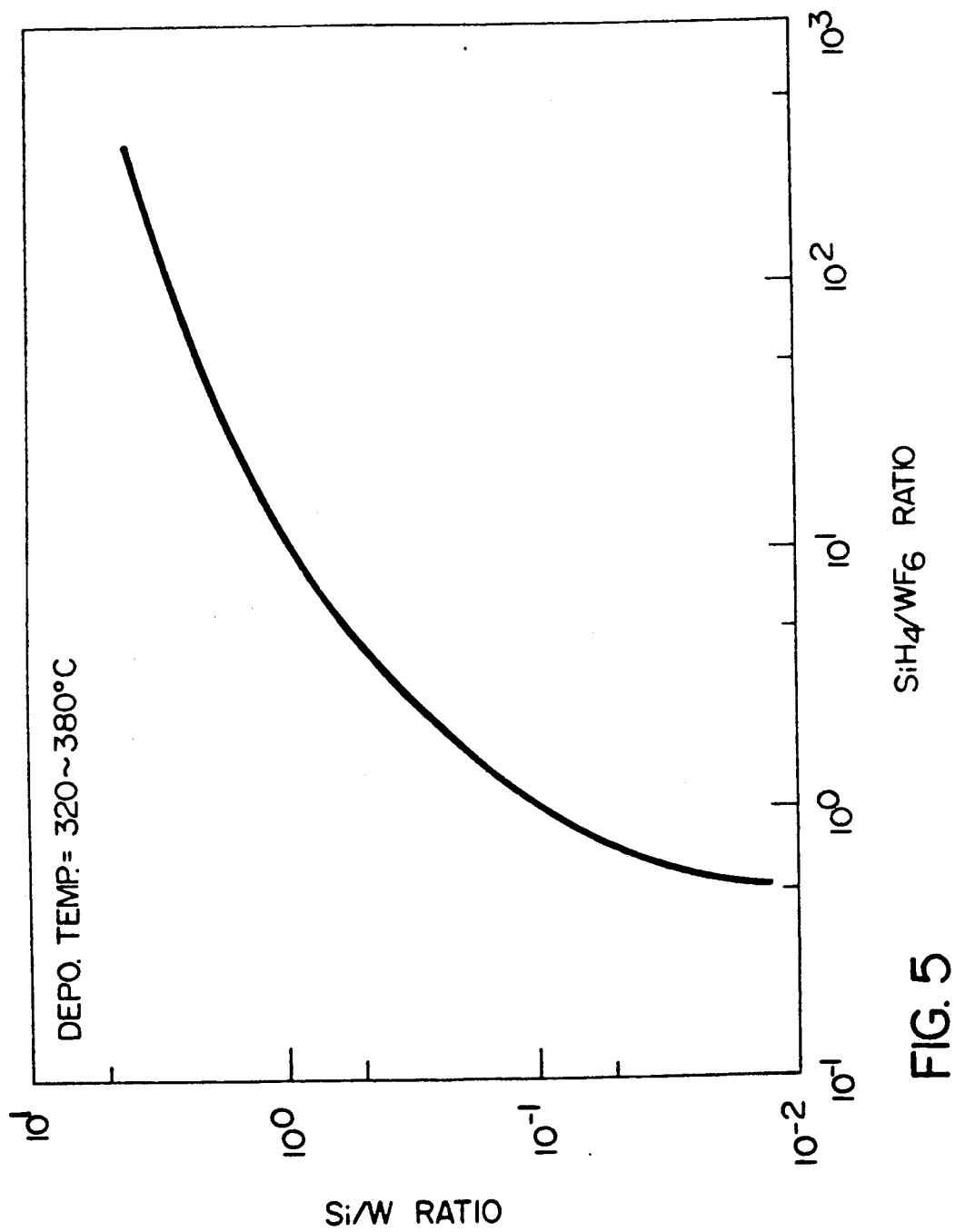
FIG. 5 is a graph showing the Si/W ration of a deposited layer vs. the $SiH_4WF_6$ process gas ratio.

As seen by the reduction reactions equations 2 and 3, as the quantity of SiH$_4$ involved in the reduction reaction exceeds 1.5 the quantity of WF$_6$, silicon atoms are also deposited along with the tungsten. This is desirable since, later, when the wafer is annealed to silicide the refractory metal/silicon substrate junction, there will be no consumption of the silicon substrate as a result of using a silicon based reducing gas. The anneal step also silicides and densifies the entire deposited layer, which lowers the resistivity of the barrier layer. Thus, the amounts of WF$_6$ and SiH$_4$ injected into the CVD reaction chamber are preferably set to deposit a layer of WSi$_x$, where x depends on the process parameters. FIG. 5 is a graph showing the resulting Si/W ratio in a deposited layer at a deposition temperature of 320+ -380° C. in response to varying the SiH$_4$/WF$_6$ ratio.

Inportantly, during the preferred embodiment of step 7, the amount of SiH$_4$ reducing gas provided to the CVD chamber is ramped to follow the increasing temperature of the contact area. Since the reduction reaction of the WF$_6$ (or other refractory metal based gas) when combined with SiH$_4$ is an exothermic reaction, as more tungsten is being deposited, the temperature of the deposited tungsten increases. As the temperature of the contact area increases, the ramped up supply of SiH$_4$ increases the deposition rate of the refractory metal while the desirable columnar grain structure of the barrier layer is maintained due to the increased temperature at which the reaction occurs. Care must be taken to not supply too much SiH$_4$ to the reaction prior to the temperature of the contact area rising to a certain level to maintain the columnar grain structure or else the grain structure of the resulting barrier layer will grow rapidly in an undesirable isotropic fashion.

Thus, by ramping up the supply of SiH$_4$ to the reaction chamber, the deposition rate of refractory metal is increased without incurring any adverse effects. In the prior art, it was not appreciated that the desired columnar grain structure could be maintained with an increasing supply of SiH$_4$ ramped up as the temperature of the contact areas increase.

Figure 1D:
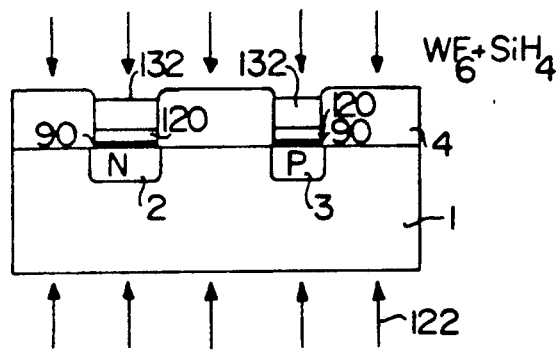

The resulting structure after step 7 is shown in FIG. 1d. In the preferred embodiment, the deposited barrier layer 132 is formed to comprise between 5 and 20 atomic % Si (or between 1 and 4 weight % Si). Using the above-described process, the layer 132 comprises approximately 12 atomic % Si, although all that is needed is for the composition to exceed 5 atomic % Si to avoid reduction of the Si substrate.

Referring to the CVD chamber of FIG. 3, the gas routing network, of FIG. 2, and parameter settings C—H in Table I, step 7 is carried out by ramping up quartz halogen lamp 126 over a 45 second period to achieve a measured wafer temperature of 260° C. During the ramping up of lamp 126, SiH$_4$ is injected into chamber 104 at a rate of 2.6 sccm by controlling valve 24. The remaining gas flows and pressures are identical to shoe used in process parameter setting B of Table I.

After the measured temperature of 260° C. is reached, the temperature is maintained for 10 seconds (process parameter D in Table I) with gas flow rates remaining unchanged. After this time (process parameter setting E in Table I), the flow rate of SiH$_4$ is increased from 2.6 sccm to 2.8 sccm to increase the deposition rate of refractory metal as the temperature of the deposited barrier layer increases to above 260° C. due to the reducing reaction being exothermic.

In practice, the ramping of SiH$_4$ depends on the extent of exposed silicon area of the wafer. In the above-described process, it is assumed less than 3% of the wafer surface comprises exposed Si. If more of the silicon is exposed, the SiH$_4$ may be ramped up faster.

During each of sequential process parameter settings F, G, and H, each lasting for ten seconds, the supply of SiH$_4$ is increased in increments of 0.2 sccm, until a final flow rate of 3.4 sccm is achieved for the SiH$_4$.

A(8). REMOVAL OF PROCESS GASES FROM CHAMBER AND ANNEAL

In step 8, the wafer is allowed to cool, the process gases are removed from the chamber, and a rapid thermal anneal step is used to silicide the refractory metal/silicon substrate interface and thereby lower the contact resistivity. Also, during this step, the silicon atoms within the barrier layer react with the deposited refractory metal to form a silicide. Since the reducing gas is silicon based, the deposited refractory metal already contains silicon, and the silicon substrate is not significantly consumed during this step. In the preferred embodiment, this anneal is accomplished at between approximately 650° C. to 900° C. for approximately 10-30 seconds.

Table I, in parameter settings I-K, shows the preferred cool-down and purging step conducted prior to annealing, where, in setting I, lamp 126 is turned off, the injection of process gases SiH$_4$, H$_2$, Ar, and WF$_6$ into the chamber is ceased by closing the appropriate valves in FIG. 2, and the pressures in reaction camber 104 and backside chamber 114 are reduced to less than 18 mtorr.

In parameter setting J, H$_2$ is allowed to enter reaction chamber 104 at a flow rate of 300 sccm, and Ar is allowed to enter reaction chamber 104 at a flow rate of 50 sccm, in order to promote cooling of the wafer and to purge gas lines 52 and 54 and reaction chamber 104 of any remaining SiH$_4$ and WF$_6$. The pressure in reaction chamber 104 is kept at 800 mtorr, while the backside chamber pressure is held at 1.0 torr. Setting J is held for approximately 45 seconds so that the wafer is sufficiently cooled and the lines and reaction chamber are sufficiently purged.

In parameter setting K, the gases are removed from reaction chamber 104, and the pressures in reaction chamber 104 and backside chamber 114 are lowered to below 18 mtorr for five seconds.

The anneal step is conducted during process parameter setting L, where lamp 126 is supplied ramped power to heat the wafer to approximately 700° C. over a 20 second period. During this time, H$_2$ is supplied to reaction chamber 104 at a rate of 150 sccm, and Ar is supplied to reaction chamber 104 at a rate of 5 sccm. The pressure in reaction chamber 104 is maintained at 80 mtorr, while the backside chamber 114 pressure is maintained at 0.5 mtorr. During this anneal step, the deposited barrier layer densifies and shrinks approximately 10%. this shrinkage is primarily due to the tungsten bonding with the silicon within barrier layer 132. The amount of shrinkage depends on the anneal temperature and the Si content in barrier layer 132.

The resulting barrier layer 132 formed during the preferred process steps 5-8 (parameter settings A-L of Table I) is approximately 6500 Å thick.

A(9). COOL DOWN WAFER AD REMOVE FROM CVD CHAMBER

In step 9, the wafer is cooled down after annealing to bring the substrate to a temperature below 100° C., before removal from the CVD chamber. This cooling step is accomplished by turning off power to lamp 126 and allowing the wafer to cool for at least 45 second stop approach ambient temperature. To promote further cooling, gases H$_2$ and Ar may be injected into reaction chamber 104 at flow rates of 300 sccm and 50 sccm, respectively, for approximately 45 seconds while providing a reaction chamber pressure of 800 mtorr and a backside chamber pressure of 1.0 torr. The H$_2$ and Ar gases are then shut off, and the wafer is removed from the reaction chamber.

A(10). CONDUCT METALLIZATION

Figure 1E:
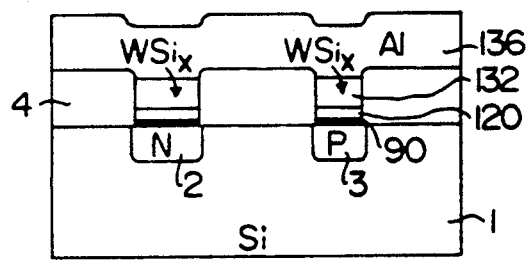

After the barrier layer is formed, an aluminum deposition process, or other applicable metal or polysilicon deposition process, is conducted, using conventional techniques, to form a conductive interconnect layer over the deposited barrier layer, In the preferred embodiment, aluminum is deposited for he interconnect layer using a sputter deposition process. The resulting structure is shown in FIG. 1e, where conductive layer (Al) 136 is shown overlying barrier layer 132.

A(11). ADDITIONAL FEATURES

To achieve best results during refractory metal deposition steps 4-7, the residue time of reaction by-products (e.g., silicon fluorides) should be kept to below 10 milliseconds. Residence time is calculated as follows:

$$\tau = \frac{V}{S} = \frac{pV}{Q}, \text{ where} \quad \text{(eq. 4)}$$

$\tau$ = residence time (seconds)
V = volume of CVD chamber (liters)
S = rate of gas being pumped away (liters/second)
P = pressure of chamber (torr)
Q = flow rate of gas into chamber (torr.liters/second)

In the preferred embodiment structure, the pumping manifold to the CVD process chamber has a conductance of $\geq 50$ torr liters per second. Using a chamber pressure of 120 mtorr and a chamber volume of 49 liters, the residence time of the gas within the process chamber will be approximately $9.8 \times 10^{-3}$ seconds.

Further, the process gases entering the CVD chamber should be kept to at least 99.999 designated purity, and critical gas flows should be controlled to within ±0.2 sccm of flow setpoint from wafer to wafer to achieve sufficient repeatability. Additionally, the liquid gas container containing the WF$_6$ (or other refractory metal based gas) is cooled to preferably 5° C. below room temperature to prevent condensation of the gas in the gas lines.

The above-described process for forming a barrier layer over regions of silicon may be used with other than the process gases specifically described with respect to the preferred embodiment. For example, refractory metal based gases comprising refractory metals molybdenum, palladium, platinum, or tantalum may be used. A reducing gas other than that described in the preferred embodiment may also be used where appropriate. Of course, the gas flow rates, temperatures, process times, pressures, and apparatus limitations described with respect to the preferred embodiment process may be modified as necessary to form a barrier layer having the desired characteristics.

Further information regarding the characteristics of tungsten silicide and regarding various other processes for forming a silicide layer are found in the following publications, incorporated herein by reference: 1) VSLI Process Technologies, ICVC '89, published Oct. 17, 1989; 2) presentation materials entitled "Chemical Vapor Deposition of Interconnect Metals (emphasizing Tungsten)" by Robert S. Blewer, Jan. 25, 1988.

B. BLANKET DEPOSITION PROCESS

In blanket deposition, a refractory metal is deposited on the exposed silicon regions as well as on the surface of the insulating silicon dioxide layer. Typically, after blanket deposition, the refractory metal layer deposited over the oxide layer is then completely etched away using a blanket etch so that the refractory metal remains only over the silicon regions to be electrically contacted by the refractory metal. A metallization layer is then typically formed over the surface of the wafer to contact the deposited refractory metal in order to electrically contact the underlying silicon regions.

Other uses of blanket depositions include depositing the refractory metal over a gate oxide layer and selectively etching the refractory metal layer to form gates for MOS devices.

In the preferred process to blanket deposit a refractory metal over the surface of a patterned wafer, the preliminary steps 1–4 of cleaning the surface of the silicon wafer, removing any damage to the silicon crystal lattice, and purging the various gas lines are conducted as described above with respect to steps 1–4.

Figure 7A:
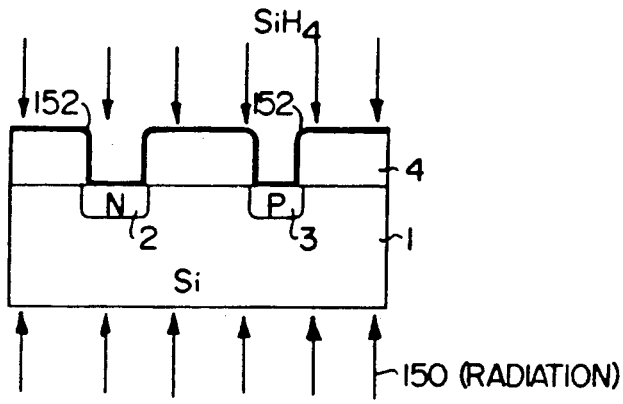
FIGS. 7a-7d are cross-sectional diagrams of a silicon wafer undergoing a blanket deposition process in accordance with a preferred embodiment of the invention.

In step 5 of the preferred embodiment blanket deposition process, after steps 1–4 are carried out and the wafer is placed in a CVD chamber such as that shown in FIG. 3, the wafer is then heated to a deposition temperature of approximately 500° C., and $SiH_4$ is allowed to enter the chamber to nucleate with the exposed silicon and $SiO_2$ for a period of approximately two seconds. This forms a few monolayers of $SiH_4$ over the $SiO_2$ to enable the subsequent reduction of $WF_6$ when $WF_6$ is later allowed to enter the chamber. FIG. 7a shows this step where radiant heat 150 supplied by lamp 126 in FIG. 3 heats wafer 1 during eh injection of $SiH_4$ into CVD chamber 104, causing a deposition of thin $SiH_4$ layer 152 over the surface of wafer 1.

The various pressures and flow rates of process gases $SiH_4$ and $H_2$ are similar to that shown in parameter setting C in Table I. No $WF_6$ or Ar is injected at this time.

Figure 7B:
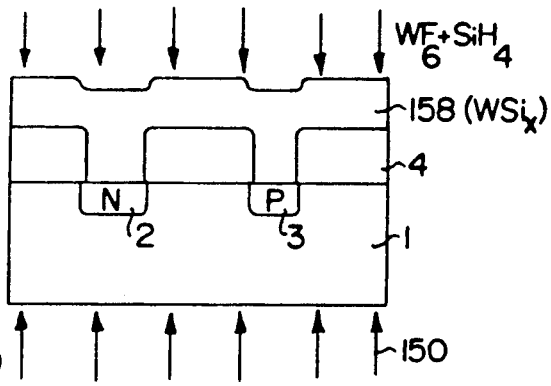

In step 6, a depositioning process similar to that described with respect to step 7 of the selective deposition process, previously described, is conducted, where $WF_6$ is injected into the CVD chamber along with $SiH_4$. This step is conducted until a barrier layer composed of $WSi_x$, where x depends on the ratio of $SiH_4$ to $WF_6$ used during the deposition process, having a desired thickness is formed over both the silicon and the oxide. The ratio of $SiH_4$ to $WF_6$ is reduced to below unity in order to achieve a columnar grain structure. This step is shown in FIG. 7b where deposited layer 158 is formed over the surface of the wafer 1.

In the preferred embodiment process, this deposition step is conducted generally using parameter settings D-H of Table I, where the quantity of reducing gas $SiH_4$ is ramped up with time as the exothermic reduction gas $SiH_4$ is ramped up with time as the exothermic reduction reactions continually raise the temperature at the surface of the deposited barrier layer 158. In this step, however, the deposition temperature is maintained at approximately 500° C.

Ramping should be ceased at the time when there is no further increase in barrier layer temperature due to the heat produced by the exothermic reduction reactions being more quickly removed as the barrier layer fills the contact regions.

In step 7, after the barrier layer 158 is deposited, the gas lines and the CVD process chamber are purged and the wafer is cooled similar to the described with respect to step 7 of the above-described process and parameter settings I-K in Table I.

An anneal step is conducted at temperature of between 650° C. to 900° C. for approximately 10–30 seconds with process parameter settings similar to that in parameter setting L of Table I.

Figure 7C:
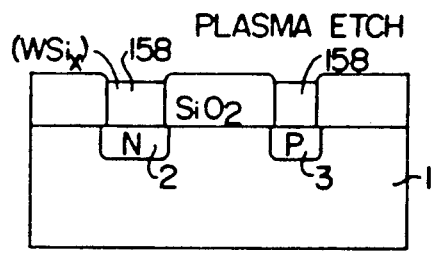

The resulting barrier layer 158 is then etched using one of any number of well known blanket plasma etching techniques, or other acceptable etching technique, so as to leave the deposited barrier layer 158 only within the contact areas, such as shown in FIG. 7c. In certain applications, this barrier layer 158 may be used as an interconnect layer and, thus, no blanket etch would be conducted.

Figure 7D:
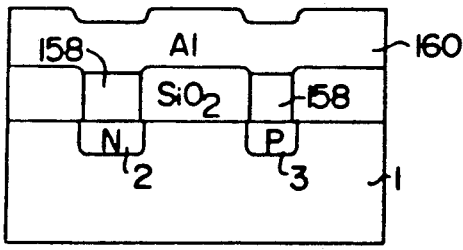

A metallization layer or other conductive layer 160 is then deposited and etched, as shown in FIG. 7d. Conductive layer 160 forms an ohmic contact with the deposited barrier layer 158 and with regions 2 and 3.

Additional features to improve the quality of the deposited barrier layer are identical to those described with respect to the process described above, for selectively forming a refractory metal silicide layer.

C. DEPOSITION PROCESS FOR FORMING A VIA ON A POLYSILICON LAYER

The process described in steps 1–9 of the selective deposition process or steps 1–7 of the blanket deposition process may generally be used to from vias between a polysilicon layer and a metal layer or between two metal layers.

Figure 8:
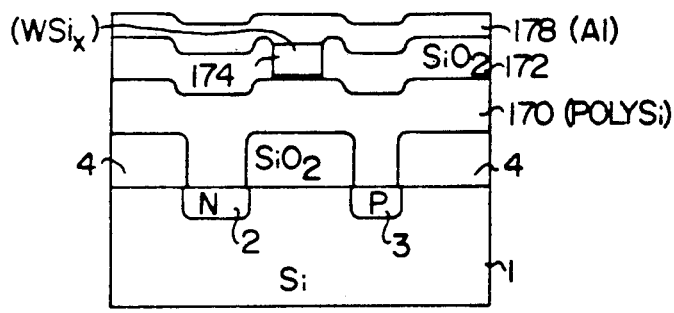
FIG. 8 is a cross-sectional diagram of a silicon wafer after completion of ha process for forming a via between a polysilicon layer and a metal layer in accordance with a preferred embodiment of the invention.

A representative wafer having a via formed in accordance with the preferred method is shown in FIG. 8. In FIG. 8, wafer 1 includes N type region 2 and P type region 3. Polysilicon layer 170 is formed using conventional methods to contact regions 2 and 3. Oxide layer 4 insulates polysilicon layer 170 for the silicon wafer 1. Insulating layer 172 is formed over polysilicon layer 170 to expose a contact portion of polysilicon layer 170, over which is deposited refractory metal via 174. In FIG. 8, refractory metal via 174 comprises $WSi_x$, where x depends on the ratio of reducing gas $SiH_4$ to $WF_6$ used in the deposition process. A metal layer 178, such as comprising AlSi, is then formed over insulating layer 172 to contact via 174 and to provide an electrical connection between metal layer 178 and polysilicon layer 170.

When depositing a refractory metal on a polysilicon layer to form a via, the wafer is cleaned in accordance with previously described steps 1 and 2, and the gas lines and CVD chamber are purged in accordance with previously described step 4. Step 3 of the previously described process for removing any damage to the crystal lattice structure of the substrate is, of course, deleted.

In a selective deposition process to form a via, although there are not problems with different emissivities of N and P regions in the polysilicon layer, it is still desirable to conduct step 6 to deposit a thin layer of refractory metal on the polysilicon prior to injecting SiH$_4$ into the CVD chamber to achieve a stronger bond between the via and the polysilicon and to ensure selectivity. A thin layer of the polysilicon will be consumed.

The remaining deposition and anneal steps for the selective deposition process are basically identical to those previously described for forming a conductive barrier layer between regions in a substrate and a metal layer. Of course, process times, gas flow rates, and temperatures may be changed to achieve the desired characteristics of the deposited refractory metal via.

For blanket deposition, SiH$_4$ is first injected into the chamber at a deposition temperature of approximately 500° C. for approximately 2 seconds to form a thin SiH$_4$ layer over the surface of the wafer. This method is similar to that discussed with respect to FIG. 7a. WF$_6$, along with SiH$_4$, is then introduced to form a barrier layer similar to that described with respect to FIG. 7b. The deposited layer is etched, and a metallization process is conducted similar to the method discussed with respect to FIGS. 7c and 7d.

DEPOSITION PROCESS FOR FORMING A VIA ON A METAL LAYER

To form a via between two aluminum layers, or between any two metal layers, it is desirable to form the aluminum layers to contain silicon atoms to prevent the Al atoms from reacting with the oxide surface of the wafer.

Figure 9A:
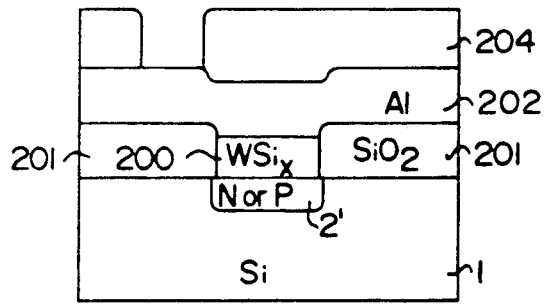
FIGS. 9a-9d are cross-sectional diagrams of a silicon wafer after completion of a process for forming a via between two metal layers in accordance with a preferred embodiment of the invention.

To selectively deposit a refractory metal layer over an aluminum layer to create a via, a patterned layer of oxide 201 or other insulating material is formed over the aluminum layer, using conventional techniques, to expose contact regions. This starting structure is shown in FIG. 9a. FIG. 9a shows wafer 1 having P or N type region 2' formed therein and contacted by refractory metal barrier layer 200, formed by methods previously described herein. Over barrier layer 200 is formed aluminum layer 202, over which is formed patterned oxide layer 204. The following preferred process is then implemented.

D(1). CLEAN WAFER SURFACE

Figure 10:
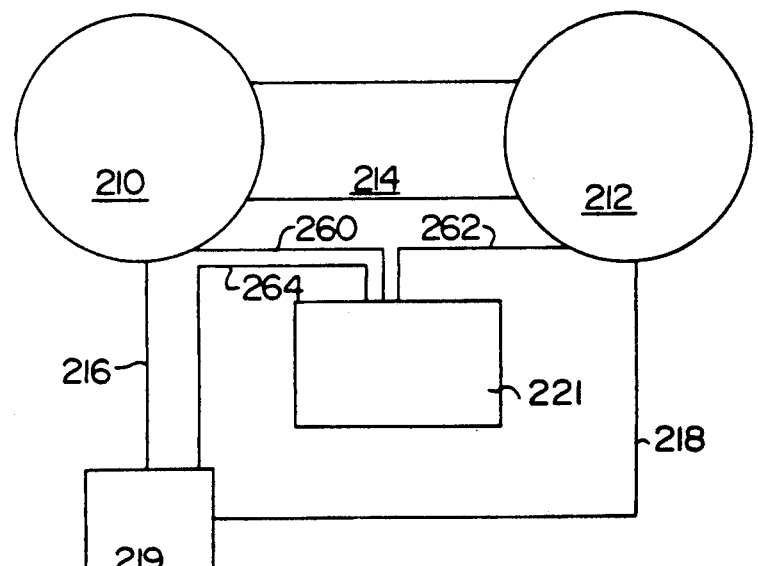
FIG. 10 shows a preferred embodiment structure for carrying out a via formation process.

In step 1, to selectively deposit a barrier layer over aluminum layer 202, the exposed aluminum is cleaned by, preferably, using a conventional RF sputter etch process. In a preferred embodiment, Ar ions are used in the sputter etch using a bias voltage of −600 volts or less. In a preferred embodiment structure for carrying out this etch step, a Varian Model 5101 CVD system is modified to have a sputter etch station connected thereto, as shown in FIG. 10. The Varian 5101 CVD chamber has been previously described with respect to FIG. 3 and is described in U.S. Pat. No. 4,796,562.

In FIG. 10, CVD chamber 210 is connected to sputter etch chamber 212 via a wafer transport system 214. Load locks (not shown) between wafer transport system 214 and chambers 210 and 212 are used so that the pressure in chamber 210 is not affected by the pressure in chamber 212 while wafer transport system 214 is not being used. Connected to CVD chamber 210 and sputter etch chamber 212 are gas lines 216 and 218 from gas box 219, which is described with respect to FIG. 2.

Figure 11:
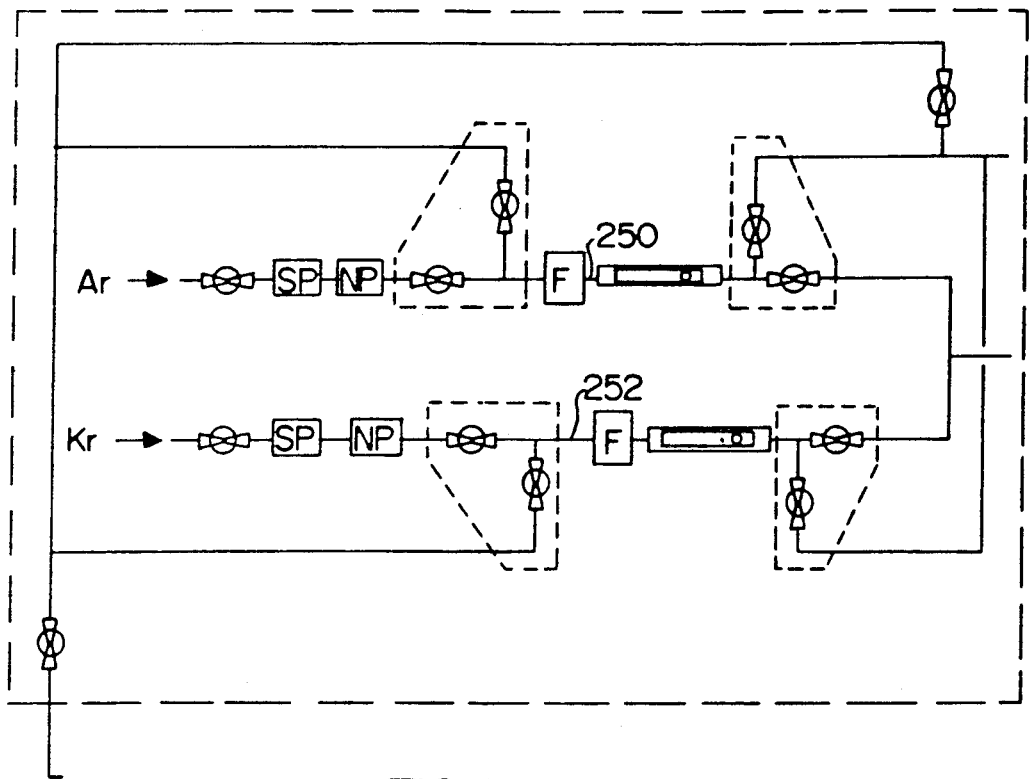
FIG. 11 shows the gas distribution network for sputter etch gases.
Figure 12:
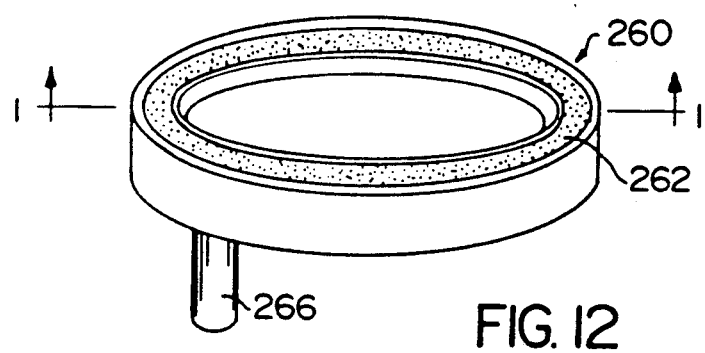
FIGS. 12 and 13 show perspective views of a gas diffusing measured in the preferred embodiment of the invention.

The Ar gas supplied to sputter etch chamber 212 via gas line 218 is controlled by the valve arrangement shown in FIG. 11, which is located within gas box 219 and adjacent network 5 shown in FIG. 2a. In FIG. 11, the various filters, MFC, and valves associated with Ar gas line 250 are similar to those corresponding components connected to Ar gas line 46 in FIG. 2a. In FIG. 11, a krypton gas source is shown connected to Kr gas line 252. This Kr source and associated valves are not used in the preferred sputter etch process.

Automated control system 221 controls the various functions of CVD chamber 210, sputter etch chamber 212, wafer transport system 214 and gas box 219 by sending the appropriate signals on wires 260, 262, and 264, respectively.

In the preferred embodiment process, the wafer of FIG. 9a is placed in a cassette tray and the cassette tray is placed into a cassette chamber within wafer transport system 214. Wafer transport system 214 is similar to that described in U.S. Pat. No. 4,796,562. The wafer transport system 214 uses manipulator arms to place a wafer from the cassette tray into sputter etch chamber 212, which at a very low pressure (e.g., $1 \times 10^{-4}$ torr). Sputter etch chamber 212 containing Ar gas is then operated for cleaning the surface of the wafer to remove any oxide for the surface of aluminum layer 202 and to remove any contaminants from the surface of the wafer which may adversely affect the selective deposition of the refractory metal on aluminum layer 202. This step also cleans the SiO$_2$ surface to prevent any subsequent nucleation of WF$_6$ or SiH$_4$ process gases with the SiO$_2$ surface.

In the preferred embodiment a sputter etch using a bias voltage of preferably −580 volts and 400 watts of RF power is conducted at room temperature for approximately 60 seconds at a pressure of 14 mtorr and an Ar gas flow rate of 48.5 sccm.

After this etching step is conducted, wafer transport system 214 and sputter etch chamber 212 are pulled down to a pressure of approximately $1 \times 10^{-4}$ torr. The load lock between sputter etch chamber 212 and wafer transport system 214 is then opened so that the wafer may be transported via a manipulator arm out of sputter etch chamber 212.

The load locked between wafer transport system 214 and sputter etch chamber 212 is closed and the load lock between wafer transport system 214 and CVD chamber 210 is opened so that the manipulator arm can place the etched wafer into position within CVD chamber 210 without he wafer becoming contaminated. Once the wafer has been transported to CVD chamber 210 and clamped by wafer clamp assembly 100 onto quartz chuck 102, as shown in FIG. 3 and described in U.S. Pat. No. 4,796,562, wafer transport system 214 is sealed off from CVD chamber 210 and the following deposition process is conducted.

The preferred process for forming a via contacting two aluminum layers after the wafer is cleaned in step 1 is shown below in Table II.

TABLE II

| Parameter Setting | Dur. (sec) | Temp. (°C.) | Pressure (mtorr) | BSGAS (torr) | SiH$_4$ (sccm) | WF$_6$ (sccm) | H$_2$ (sccm) | Ar (sccm) |
|---|---|---|---|---|---|---|---|---|
| A | 7 | A (≦30° C.) | 50 | 0.5 | 0 | 4.0 | 150 | 5 |
| B | 120 | 450 | 50 | 0.5 | 0 | 4.0 | 150 | 5 |
| C | 45 | A (450→A) | 800 | 1.0 | 0 | 4.0 | 300 | 50 |
| D | 5 | A | BASE (≦18 mtorr) | 0 | 0 | 0 | 0 | 0 |
| E | 7 | A | 70 | 0.5 | 0 | 4.0 | 150 | 5 |
| F | 5 | A | 70 | 0.5 | 2.6 | 4.0 | 150 | 5 |
| G | 45 | 500 (A→500) | 70 | 0.5 | 2.6 | 4.0 | 150 | 5 |
| H | 10 | 500 | 70 | 0.5 | 2.6 | 4.0 | 150 | 5 |
| I | 10 | 500 | 70 | 0.5 | 2.8 | 4.0 | 150 | 5 |
| J | 10 | 500 | 70 | 0.5 | 3.0 | 4.0 | 150 | 5 |
| K | 10 | 500 | 70 | 0.5 | 3.2 | 4.0 | 150 | 5 |
| L | 10 | 500 | 70 | 0.5 | 3.4 | 4.0 | 150 | 5 |
| M | 5 | A (500→A) | BASE | 0 | 0 | 0 | 0 | 0 |
| N | 45 | A (500→A) | 800 | 1.0 | 0 | 0 | 300 | 50 |
| O | 5 | A | BASE | 0 | 0 | 0 | 0 | 0 |

After the wafer is sputter etched, the wafer undergoes a saturation step in step 2 wherein a refractory metal based gas is injected into the CVD chamber at room temperature (e.g., less than 30° C.) for a short period. In a preferred embodiment, step 2, shown as parameter setting A in Table II, is conducted for seven seconds with a WF$_6$ flow rate of 4.0 sccm, a H$_2$ flow rate of 150 sccm, and an Ar flow rate of 5 sccm. Referring to the CVD chamber shown in FIG. 3, during this step, reaction chamber 104 is made to have a pressure of 50 mtorr and backside chamber 114 is made to have a pressure of 0.5 torr. This step is used to improve bonding between the subsequently formed via and the metal layer.

D(3). FORM INITIAL LAYER OF REFRACTORY METAL ON EXPOSED ALUMINUM SURFACE

In step 3, shown in Table II as parameter settings B-D, the temperature of the wafer is raised to approximately 450° C. for 120 seconds, and the refractory metal gased gas is injected into the chamber along with H$_2$ and Ar, at the same flow rates as in parameter setting A.

Selective deposition of the refractory metal on only the aluminum metal layer occurs since, initially, the WF$_6$ reacts with the aluminum layer to deposit a few monolayers of refractory metal in accordance with the following equation:

$$WF_6 + 2Al \rightarrow 2AlF_3 + W \qquad (eq. 5)$$

At the 450° C. deposition temperature, the patterned oxide layer overlying the aluminum layer does not cause a reduction reaction to occur when contacted by WF$_6$. Once the initial layer of the refractory metal is formed on the aluminum, the H$_2$ is able to reduce the refractory metal based gas at the surface of the aluminum layer in accordance with the following equation:

$$WF_6 + 3H_2 \rightarrow W + 6HF \qquad (eq. 6)$$

As shown in parameter setting C of Table II, the temperature of the wafer is ramped down to ambient temperature and the pressure inside the CVD chamber is increased.

As shown in parameter setting D, the gases in the chamber are purged. As discussed previously, the appropriate valves, shown in FIG. 2, are operated to inject the desired flow rate of process gases into the CVD chamber.

Figure 9B:
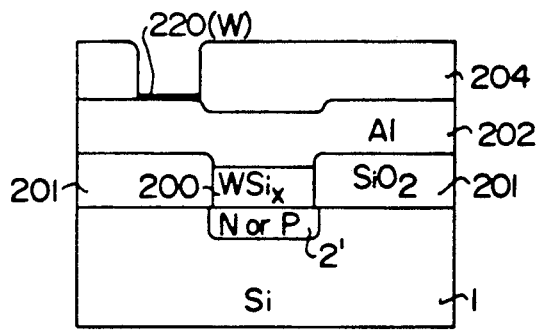

The resulting wafer after completion of step 3 is shown in FIG. 9b, where refractory layer 220 is deposited on aluminum layer 202.

D(4). DEPOSITION USING REDUCING GAS SiH$_4$

In parameter setting E, at room temperature, WF$_6$, H$_2$, and Ar gases are again injected into the CVD chamber for approximately seven seconds prior to SiH$_4$ being injected into the chamber to ensure an overabundance of WF$_6$ in the CVD chamber when SiH$_4$ is subsequently injected into the CVD chamber.

In step 4, shown as parameter setting F, SiH$_4$ is injected into the CVD chamber for about five seconds prior to the wafer being ramped up in temperature. SiH$_4$ is used to obtain a high deposition rate of the refractory metal over the exposed aluminum layer.

Also in step 4, as shown in parameter settings G-L, the temperature of the wafer is ramped up to approximately 500° C. over a period of 45 seconds and maintained at this temperature for 50 seconds. During this time, the supply of SiH$_4$ is ramped up from 2.6 sccm to 3.4 sccm so as to increase the deposition rate of the refractory metal as the temperature of the deposited refractory metal layer increases due to the exothermic reduction reactions. As previously described, although an increased amount of SiH$_4$ is supplied to the reaction, the columnar grain structure of the deposited refractory metal is preserved due to the increased temperature of the deposited refractory metal from the exothermic reduction reactions.

Figure 9C:
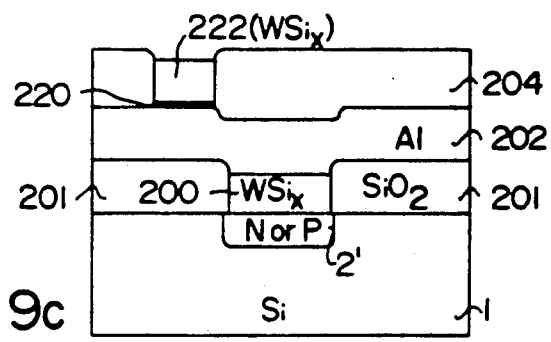

The resulting wafer after completion of step 4 is shown in FIG. 9c, where deposited refractory metal (WSi$_x$) layer 222 is deposited over refractory metal (W) layer 220.

D(5). COOL DOWN WAFER

In step 5, corresponding to parameter settings M-O, the wafer is cooled by ramping down power to lamp 126 in FIG. 3 as the gases in the CVD chamber are evacuated. In parameter setting N, the temperature of the wafer is further ramped down to ambient temperature over a period of 45 seconds by lowering the power applied to lamp 126 in FIG. 3. H$_2$ and Ar are injected into the CVD chamber to achieve a pressure in CVD chamber 104 of 800 mtorr and a pressure in backside chamber 114 of 1.0 torr. The process gases are again removed as shown in parameter setting O.

The CVD chamber is pumped out, and the load lock between wafer transport system 214 and CVD chamber 210 is opened The manipulator arm removes the wafer from CVD chamber 210 and places it into a cassette within wafer transport system 214 in a manner similar to that described in U.S. Pat. No. 4,796,562. To remove the wafer from wafer transport system 214, $N_2$ is injected into wafer transport system 214 to pressurize system 214 to slightly higher than atmospheric pressure. The cassette containing the wafer (and containing other wafers in the lot) is then removed.

There is no anneal step necessary to form a silicide of the deposited layer at this stage, since an anneal step will be performed anyway after the wafer has undergone all processing steps.

The above-described process forms a via of approximately one micron in thickness.

Figure 9D:
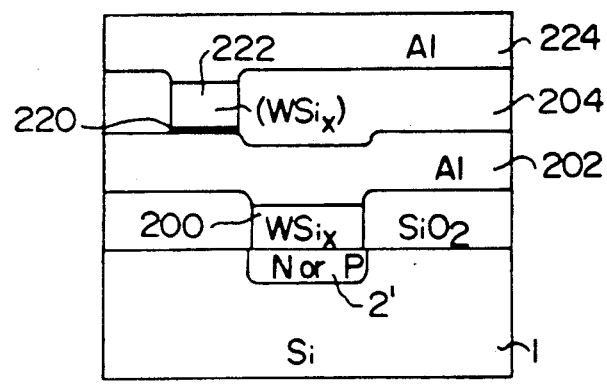

An aluminum layer 224 is then formed over the surface of the wafer, as shown in FIG. 9d, using conventional techniques. Deposited refractory metal 222 now forms a via between aluminum layers 202 and 224.

E. BLANKET DEPOSITION PROCESS FOR FORMING A VIA BETWEEN TWO METAL LAYERS

To form a refractory metal via between two metal layers using blanket deposition, no sputter etching of the wafer surface is required. Thus, the wafer is initially placed in CVD chamber 210 in FIG. 10 via wafer transport system 214.

$SiH_4$ is injected into CVD chamber 210 at a deposition temperature of between 265° C. and 500° C. for two seconds to promote blanket deposition on the aluminum as well as the oxide surface.

$WF_6$ is then injected, along with the $SiH_4$, until a barrier layer of a desired thickness is formed. This blanket deposition process described thus far is identical to that described with respect to FIGS. 7a and 7b, except the deposition temperature must not exceed 500° C. due to the relatively low melting point of aluminum.

After the refractory metal barrier layer is deposited to the desired thickness, the refractory metal is etched so as to leave only a via having a desired thickness.

An upper metal layer is then formed, using conventional techniques, over the wafer surface.

The resulting structure is similar to that shown in FIG. 9d, except pure refractory metal layer 220 is not formed during this blanket deposition process.

As in the previously described processes, to ensure repeatability and good results, the residence time of reaction by-products should be kept below 10 milliseconds, the reactive gases should be kept to at least 99.999 designated purity, and critical gas flows should be controlled to within ±0.2 sccm.

F. ADDITIONAL PROCESS AND APPARATUS FEATURES

After a number of wafers are processed using any of the above-described methods, portions of the CVD chamber, such as quartz chuck 102 in FIG. 3, will become coated with a layer of refractory metal and undesirably absorb radiation and react with the gases in the process chamber. When it is desired to clean the chamber, an etch gas of $NF_3$ is injected into the chamber by, for example, opening valves 17, 37, and 38 in FIG. 2. In the prior art, this etch step is conducted while the CVD chamber is at room temperature. A drawback of this prior art method is that the $NF_3$ reacts with the quartz ($SiO_2$) in the chamber, and with any reaction by-products remaining in the chamber, and forms a condensation of $SiF_4$ or other fluorides.

To avoid this condensation problem, the reaction chamber walls are heated to above 65° C. by, for example, a closed loop heating unit such as that manufactured by Mydax, while maintaining a chamber pressure of less than approximately 80 mtorr during etching the chamber with $NF_3$. Any condensation is avoided in this novel process, since at this temperature, the $SiF_4$ or other formed fluoride is volatile and is purged away with the $N_3$.

Table II below shows a preferred process for conducting this $NF_3$ etch of the CVD chamber, such as CVD chamber 104 in FIG. 3.

TABLE III

| Step | $NF_3$ | $H_2$ | Time | Press | RF Power | Wall Temp. |
|---|---|---|---|---|---|---|
| A | 50 sccm | 0 | 5' | 80 mtorr | 200 W | 90° C. |
| B | 0 | 0 | 5' | 80 | 0 | 90° C. |
| C | 0 | 175 sccm | 5' | 80 | 200 W | 90° C. |
| D | 0 | 0 | 5' | 80 | 0 | 90° C. |
| E | 0 | 350 sccm | 5' | 800 | 0 | 90° C. |
| F | 0 | 0 | 5' | 80 | 0 | 90° C. |

In step A of Table II, 50 sccm of $NF_3$ is injected into CVD chamber 104 of FIG. 3 at a low pressure (at or below 80 mtorr). Two hundred watts of RF power is then applied for a period of approximately five minutes, while the quartize walls of the CVD chamber are kept at approximately 90° C. No backside gas is used to pressurize backside chamber 114 in FIG. 3.

In step B, the RF power is turned off and the $NF_3$ gas is withdrawn for the chamber.

In step C, 175 sccm of $H_2$is injected into the CVD chamber, and RF power of 200 watts is again applied for five minutes to clean up residue in the chamber.

In step D, the chamber is again evacuated.

In step E, 350 sccm of $H_2$ is injected into the CVD chamber at a chamber pressure of 800 mtorr for five minutes to flush out impurities from the etching process.

In step F, the chamber is again evacuated.

The CVD chamber has now been cleaned and is ready for further deposition processes.

Due to the corrosive nature of $NF_3$, it is preferable to replace all copper gaskets, which are relatively reactive, in the CVD chamber with aluminum gaskets.

Figure 13:
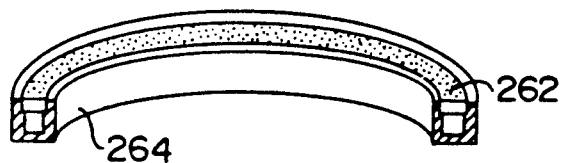

Further novel features used in the preferred process to deposit a layer of refractory metal include the use of gas ejector rings in the CVD chamber, such as rings 108 and 110 in FIG. 3, having an improved gas diffusing means so as to evenly diffuse the gas exiting the rings into the CVD chamber. In the preferred embodiment, shown in FIGS. 12 and 13, gas ejector ring 260 has fitted on its upper portion a diffusing means 262 composed of grains of stainless steel, or grains of an equivalent inert material, sintered together to randomly direct the gas escaping through spaces between the sintered grains. Preferably, the average size of the powder grains is in the range of 0.5 to 2.0 microns. In the preferred embodiment, the thickness of diffusing means 262 is 0.062 in. while the diameter of diffusing means 262 is approximately 7 in. However, diffusing means 262 and ring 264 may be any size as appropriate for the specific application.

Non-porous support ring 264 is preferably composed of stainless steel.

As a practical embodiment, the diffusing means may be formed by cutting to a desired shape a prefabricated sheet of sintered stainless steel powder, available from Mott Metallurgical Corporation, Farmington, Conn. The ring-shaped diffusing means 262 is then welded to non-porous support ring 264. An inlet port 266 allows gas to enter gas ejector ring 262.

In the preferred apparatus for conducting the various processes described herein, the various gas flows and other process parameters are performed automatically under control of a computer, shown as automated control system 221 in FIG. 10. Thus, human error is avoided by the automation of the various processes described above. One of ordinary skill in the art may easily develop a software program and control system to automate a process which will result in the desired characteristics of the deposited refractory metal layer. The software used in the preferred embodiment further controls the gas line purge function, described with respect to step 4 in the selective deposition process, previously described.

The preferred embodiments described above are intended to merely illustrate only exemplary embodiments of the processes and structures used to deposit a refractory metal and are not intended to limit invention. As should be understood, any appropriate refractory metal based gas or reducing gas may be used in the above-described processes. Various other embodiments will become obvious to those skilled in the art while keeping with the intended scope of the invention.

What is claimed is:

1. A structure for filtering process gases prior to said process gases being allowed to enter a CVD chamber, said structure comprising:
    input ports connected to sources of said process gases;
    first valve means connected immediately downstream from each of said input ports for coupling said input ports to first sections of a gas line;
    first filter means located immediately downstream from said first valve means;
    second valve means located downstream from said first filter means for coupling said first sections of said gas line to second sections of said gas line; and
    second filter means connected between said second gas valve means and said CVD chamber.

2. The structure of claim 1 further comprising an enclosure enclosing said input ports, first valve means, first filter means, second valve means, and said second filter means, and further comprising an internal heating element located within said enclosure for baking said structure to vaporize contaminants within said structure.

3. The structure of claim 1 wherein said sources of said process gases supply tungsten hexafluoride and silane.

4. The structure of claim 1 wherein said first filter means contains an organometallic compound and said second filter means is a porous gas filter.

* * * * *